(12) United States Patent
Braun et al.

(10) Patent No.: US 11,679,448 B2
(45) Date of Patent: Jun. 20, 2023

(54) BEAM-FORMING UNITS WITH COOLING SYSTEMS FOR HIGH-POWER LASERS

(71) Applicant: TRUMPF Werkzeugmaschinen GmbH + Co. KG, Ditzingen (DE)

(72) Inventors: Jens Braun, Stuttgart (DE); Björn Luong, Leonberg (DE)

(73) Assignee: TRUMPF Werkzeugmaschinen SE + Co. KG, Ditzingen (DE)

( * ) Notice: Subject to any disclaimer, the term of this patent is extended or adjusted under 35 U.S.C. 154(b) by 496 days.

(21) Appl. No.: 16/717,025

(22) Filed: Dec. 17, 2019

(65) Prior Publication Data

US 2020/0198055 A1    Jun. 25, 2020

(30) Foreign Application Priority Data

Dec. 19, 2018  (DE) .......................... 202018107281.1

(51) Int. Cl.
| | | |
|---|---|---|
| *B23K 26/70* | (2014.01) | |
| *H05K 7/20* | (2006.01) | |
| *B23K 37/00* | (2006.01) | |
| *B23K 26/06* | (2014.01) | |
| *G02B 7/18* | (2021.01) | |

(52) U.S. Cl.
CPC ........ *B23K 26/0648* (2013.01); *B23K 26/703* (2015.10); *B23K 37/003* (2013.01); *G02B 7/1815* (2013.01); *H05K 7/20145* (2013.01); *H05K 7/20272* (2013.01)

(58) Field of Classification Search
CPC ........................ B23K 26/0648; B23K 26/703; B23K 37/003; B23K 26/064; H05K 7/20145; H05K 7/20272; G02B 7/028; G02B 7/008; B02B 7/1815

USPC .................................................... 219/121.75
See application file for complete search history.

(56) References Cited

U.S. PATENT DOCUMENTS

| | | | | |
|---|---|---|---|---|
| 3,685,882 A | * | 8/1972 | Van Der Jagt ..... | B23K 26/1438 |
| | | | | 219/121.84 |
| 3,757,078 A | * | 9/1973 | Conti ................. | B23K 26/0648 |
| | | | | 219/121.75 |
| 4,324,972 A | * | 4/1982 | Furrer ................... | B23K 26/21 |
| | | | | 219/121.75 |
| 4,724,299 A | * | 2/1988 | Hammeke ........... | B23K 26/144 |
| | | | | 219/121.84 |

(Continued)

FOREIGN PATENT DOCUMENTS

| | | |
|---|---|---|
| CN | 201201128 Y | 3/2009 |
| DE | 3037981 | 6/1981 |

(Continued)

OTHER PUBLICATIONS

DE Office Action in German Appln. No. 202018107281.1, dated Jan. 18, 2022, 10 pages (with English translation).

*Primary Examiner* — Sang Y Paik
*Assistant Examiner* — Erwin J Wunderlich
(74) *Attorney, Agent, or Firm* — Fish & Richardson P.C.

(57) ABSTRACT

The disclosure relates to a beam-forming unit for forming a laser beam and focusing the laser beam onto a workpiece. The unit includes a movable component, an immovable component, and a cooling system configured for movement of a cooling medium to actively cool the movable component. The cooling system has a cooling water circuit on the immovable component configured for water cooling of both the immovable component and the cooling medium.

20 Claims, 3 Drawing Sheets

(56) References Cited

U.S. PATENT DOCUMENTS

| | | | | |
|---|---|---|---|---|
| 5,043,548 A | * | 8/1991 | Whitney | B05B 7/1486 219/121.48 |
| 5,481,556 A | * | 1/1996 | Daikuzono | H01S 3/025 372/99 |
| 6,316,744 B1 | * | 11/2001 | Nowotny | B23K 26/144 219/121.84 |
| 7,012,216 B2 | * | 3/2006 | Baker | B23K 26/0096 219/121.84 |
| 7,759,602 B2 | * | 7/2010 | Mori | B23K 26/142 219/121.75 |
| 9,667,030 B2 | * | 5/2017 | Takigawa | H01S 5/02469 |
| 9,744,622 B2 | | 8/2017 | Huonker | |
| 10,525,554 B2 | * | 1/2020 | Orlandi | B23K 26/38 |
| 10,543,568 B2 | | 1/2020 | Izumi | |
| 10,875,123 B2 | * | 12/2020 | Riemann | B23K 26/1482 |
| 11,478,881 B2 | * | 10/2022 | Stürmer | B23K 26/1462 |
| 2006/0065650 A1 | * | 3/2006 | Guo | B23K 26/144 219/121.84 |
| 2007/0193981 A1 | * | 8/2007 | Peng | B22F 12/20 219/121.33 |
| 2008/0308538 A1 | * | 12/2008 | Harris | B23K 26/34 219/121.84 |
| 2011/0024404 A1 | * | 2/2011 | Belletti | B23K 26/0648 219/121.67 |
| 2011/0149394 A1 | * | 6/2011 | Wadell | G02B 7/028 359/512 |
| 2012/0081808 A1 | | 4/2012 | Nagai et al. | |
| 2012/0154934 A1 | * | 6/2012 | Wadell | G02B 7/028 359/811 |

FOREIGN PATENT DOCUMENTS

| | | |
|---|---|---|
| DE | 112011100005 | 6/2012 |
| DE | 102012202330 | 8/2013 |
| DE | 202016005318 | 9/2016 |
| DE | 102016121318 | 5/2017 |
| EP | 3257616 A1 | 12/2017 |
| JP | 63108990 A | 5/1988 |
| JP | 2003094148 A | 4/2003 |
| WO | WO 2011131541 A1 | 10/2011 |
| WO | WO 2018163908 A1 | 9/2018 |

* cited by examiner

BEAM-FORMING UNITS WITH COOLING SYSTEMS FOR HIGH-POWER LASERS

CROSS REFERENCE TO RELATED APPLICATIONS

This application claims priority under 35 U.S.C. § 119 from German Application No. 20 2018 107 281.1, filed on Dec. 19, 2018, the entire contents of which is incorporated herein by reference.

TECHNICAL FIELD

The disclosure relates to beam-forming units for forming a laser beam onto a workpiece for laser machining, cooling systems, and laser processing machines having such a beam-forming unit.

BACKGROUND

Beam-forming units, in particular laser machining heads for laser machining, contain beam-forming optical elements (lenses or mirrors) that can be moved by a motor to adapt the focus diameter and the focus position of the laser beam to different processes and applications.

WO 2011/131541 A1, for example, describes a machining head for laser machining with solid-state laser radiation that comprises three displaceable lenses with which the focus diameter and the focus position of the laser beam can be adjusted independently of one another.

When using beam-forming units for forming solid-state laser beams with high laser power (e.g., higher than 8 kW), the heating of the optical elements must be taken into account, as it can lead to an undesired shift in the focus position (focus shift). In addition, excessive heating of the components in the machining head can lead to increased friction of movable components, which adversely affects the function of the machining head. Thus, according to WO 2011/131541 A1, when adjusting the focus diameter and the focus position, thermally induced changes in the imaging properties of the beam-forming unit are taken into account and corrected by a control unit.

EP 3 257 616 A1 discloses a laser machining head with a cooling device for cooling the optical components of the laser machining head. In this case, a gas flow is guided through expansion chambers on the optical components, which causes a cooling of the optical components. The expansion chambers are interconnected by gas lines for transporting the gas flow.

JP 63108990 A describes a laser machining head in which a transparent optical element is cooled by a gas flow and cooling water. Further cooling systems for cooling laser machining devices with cooling water are referred to in CN 201201128 Y and WO 2018/163908 A1.

The laser machining head disclosed in JP 2003094148 A is provided with a gold layer on the inside, which reflects the laser light and thereby reduces heating of the laser machining head. According to JP 2003094148 A, this is advantageous over other active cooling systems, since the use of gas or water cooling systems necessitates an enlargement of the laser machining head.

At high laser power, however, cooling by the aforementioned cooling systems may prove inadequate.

SUMMARY

This disclosure describes beam-forming units, e.g., laser machining heads, with a cooling system that sufficiently cools even at high laser powers, such as powers higher than 8 kW. Also described are laser processing machines with such beam-forming units.

The beam-forming units for forming a laser beam, such as for focusing a laser beam onto a workpiece for laser machining, have a cooling system for forced movement of a cooling medium to actively cool a movable component of the beam-forming unit, wherein the cooling system has a cooling water circuit arranged or formed on an immovable component of the beam-forming unit for water cooling of the immovable component and the cooling medium, and wherein the cooling system is arranged within an outer housing of the beam-forming unit that is sealed from the environment.

The movable component can be a mount or holder for an optical element, such as a lens mount for lenses for guiding the laser beam. The active cooling of the movable component by the moving cooling medium reduces the heating of the movable component and the lenses and associated length changes and thermal lens effects. A movable component is understood to mean a component that is movable or displaceable within the beam-forming unit.

The cooling water circuit can be fluidically connected cooling plates. The moving cooling medium is guided along the cooling water circuit and thereby cooled, before it (again) is supplied to the movable component. This concept of a heat exchanger provides effective convective and non-contact cooling of the moving component without damaging, for example, water or air hoses by the repeated traversing movements of the component, and effective heat dissipation via the immovable component and the cooling water circuit. An immovable component is understood to mean a component that is immovable or not displaceable within the beam-forming unit.

The cooling system is arranged within an outer housing of the beam-forming unit. The outer housing serves to protect the beam-forming unit from environmental influences. The outer housing is therefore sealed from the environment, so that the forced movement of the cooling medium takes place exclusively within the outer housing. The outer housing can be hermetically sealed or protected from external influences by an overpressure, for example, of the cooling medium relative to the environment.

For reflecting the laser radiation scattered within the beam-forming unit, the beam-forming unit can be at least partially provided with a coating that is highly reflective for the laser wavelength, to reduce heating of the coated part of the beam-forming unit. The combination of a cooling system, which actively moves a cooling medium, with a reflective coating of the beam-forming unit for the laser beam enhances the cooling to such an extent that, even with high laser power, the components of the beam-forming unit, e.g., the components for steering and focusing the laser beam, are sufficiently cooled. The reflective coating is reflective in the optical wavelength range, in the wavelength range from 900 nm to 1030 nm and/or in the wavelength range from 5 μm to 15 μm.

In some embodiments, the movable component has a highly reflective coating, so that the temperature increase of the movable component is reduced.

In some embodiments, the cooling system has a fan for forced-air and/or gas cooling of the movable component. The fan can introduce the gas, e.g., air, to the movable component, allowing it to flow along the component and thus effect a cooling of the movable component.

In some embodiments, the beam-forming unit has an inner housing in which the movable component is arranged.

The inner housing provides additional protection for guiding the laser beam and the movable component, and can serve as a support or attachment for components of the cooling system.

The inner housing is in the outer housing. The air flow generated by the fan(s) can pass entirely within the outer housing and through the inner housing so that no contaminants from the environment reach the machining head.

In some embodiments, the inner housing has a recessed passage (a through bore) on which the fan is arranged. The recessed passage is adjacent to a movable component. Air can be directed through the fan and the recessed passage to the movable component, the air flow being aligned with the movable component through the recessed passage.

In some embodiments, the beam-forming unit has a bellows on the movable component to shield the interior of the movable component from the air and/or gas flow generated by the fan.

In some embodiments, the inner housing is at least partially formed by the immovable component. The cooling water circuit in the form of the cooling plates is attached to the inner housing and cools both the inner housing and the air flow, which is guided along the cooling water circuit.

The concept of an air-water heat exchanger is used. In the inner housing of the machining head, the movable component is forcedly blown with air or an inert gas (e.g. nitrogen). On or in the inner housing are water-flowing cooling regions where the air or gas flow cools down again. These regions can be located adjacent to the fan(s) that generate the gas flow and pass through an opening in the inner housing to the movable component. The air or gas flow circulates within the outer housing between the components to be cooled and the cooling regions. The cooling regions can be formed by cooling plates, which are fitted to the outside of the inner housing and have water flowing through them. Alternatively, it is also possible to arrange water-flowing cooling channels in the walls of the inner housing and thus to form the cooling regions as part of the inner housing.

In some embodiments, at least one surface designed to be absorbent for the laser wavelength is on an immovable component of the beam-forming unit. The immovable component can at least partially absorb laser radiation that does not propagate along the optical axis of the beam-forming unit to protect the movable component from overheating. The radiation absorbent surface is absorbent in the optical wavelength range, in the wavelength range from 900 nm to 1030 nm, and/or in the wavelength range from 5 µm to 15 µm.

There can be portions on the immovable surfaces of the inner housing that have a surface structure or coating that absorbs the laser wavelength. These sites serve as targeted heat sinks, where radiation reflected by gold-coated components is absorbed. These radiation absorbent portions can be thermally conductively connected to cooling regions, so that the heat is dissipated from the inner housing. The radiation absorbent surfaces can be produced for example by black chrome plating so that a galvanic coating is formed, by anodizing, powder coating, spraying of graphite lacquer, or by surface treatment with laser radiation.

The radiation absorbent surfaces can alternatively or additionally be formed on cylindrical components in which the laser beam extends and that are connected to the optical element mounts and together with the mounts encompass/form a closed beam path of the laser beam. In this way, the (scattered) radiation reflected on gold-coated inner surfaces of the mounts is directed by the shortest route to the radiation absorbent surfaces where it is absorbed, without impinging on other components of the machining head and heating them. The radiation absorbent surfaces of the cylindrical components are thermally conductively connected, for example via webs, to the cooled portions of the inner housing.

The movable component (e.g., an optical element mount/holder) can be at least partially coated with a coating that is highly reflective for the laser wavelength, such as gold or a gold alloy (e.g., AuCo0.2), and is cooled by forced-air or gas cooling. The fan(s) for generating the air or gas flow is/are not located on the movable component, but on the surrounding inner housing of the machining head. Scattered laser radiation is reflected on the highly reflective coating (located, for example, on the inner surface of the mount), and the heating of the movable components is thereby significantly reduced. The resulting heat is dissipated without contact by the movable component, without, for example, water or air hoses being damaged by the repeated traversing movements of the component. In this way, the movable component is effectively cooled.

In some embodiments, the immovable component having the radiation absorbent surface is in the form of an interior cylindrical component that directly surrounds the laser beam and protects the beam path from contamination.

In some embodiments, the immovable component is connected via the bellows to the movable component. The bellows serves as a seal between the immovable and movable components and protects the region of the beam-forming unit in which the laser beam propagates.

The interior of the movable component and thus the optical element mounted/held in the component are sealed off from the air flow by bellows, so that the beam path of the laser beam is airtight and no dust particles can escape from the air flow onto the optical elements or into the beam path. The radiation absorbent surfaces can be formed on cylindrical components in which the laser beam extends and that are connected to the mounts of the optical elements via the bellows.

A laser processing machine can have a beam-forming unit according to any of the preceding embodiments. Such a laser processing machine demonstrates stable cooling of the beam-forming unit even at high laser power.

DESCRIPTION OF DRAWINGS

Additional features and advantages can be found in the following detailed description, in claims and the drawings. The various features can each be implemented in isolation or together in any desired combinations in variants of the invention. The features shown in the drawings are presented such that the particularities of the invention can be made clearly visible.

DETAILED DESCRIPTION

Figure 1:
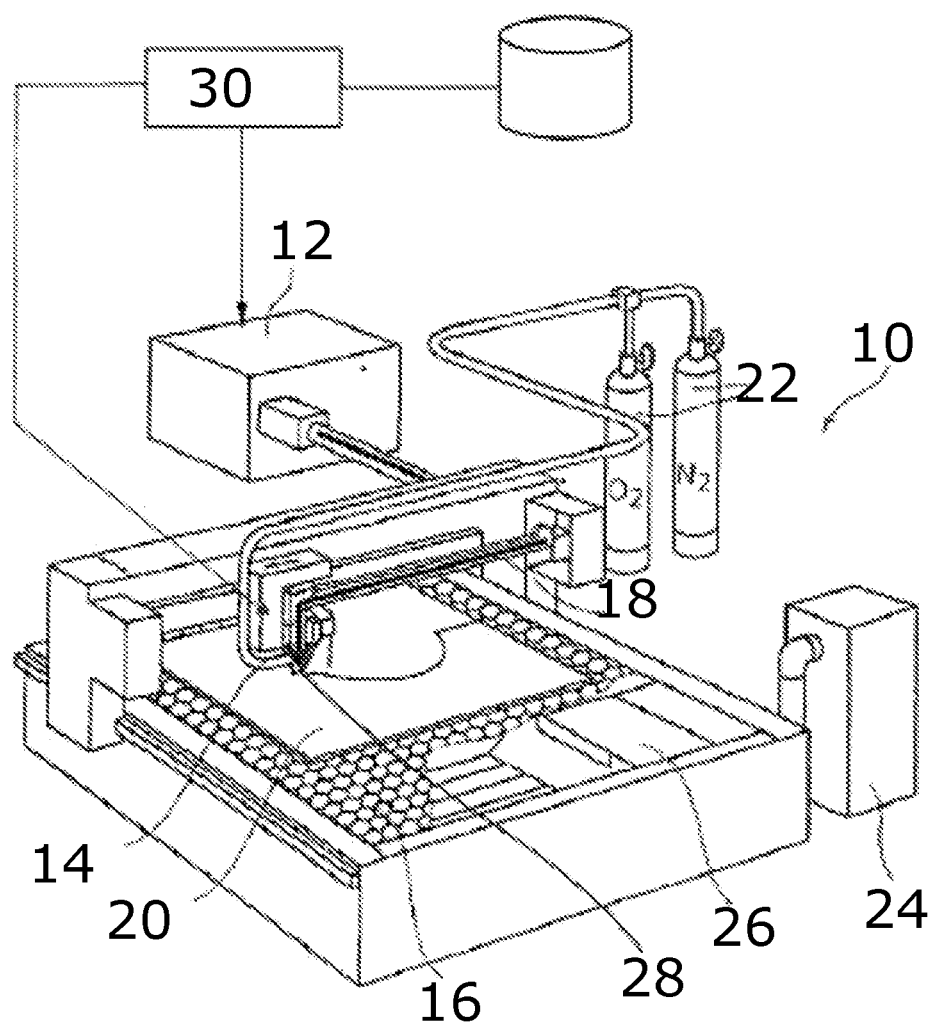
FIG. 1 is a perspective view of a laser processing machine with a beam-forming unit.

FIG. 1 is by way of example a perspective view of a laser processing machine 10. The laser processing machine 10 shown has, for example, a $CO_2$ laser, diode laser or solid-state laser as the laser beam generator 12, a beam-forming unit 14 that can be moved in the X and Y directions (such as a laser machining head), and a workpiece support 16. In the laser beam generator 12, a laser beam 18 is generated, which is guided by a (not shown) fiber-optic cable or (not shown) deflecting mirrors from the laser beam generator 12 to the machining head or to the beam-forming unit 14. A plate-shaped workpiece 20 is arranged on the workpiece support 16. The laser beam 18 is directed onto the workpiece 20 by focusing optics arranged in the machining head 14. The laser processing machine 10 (e.g., a laser cutting machine and/or laser welding machine) is also supplied with process gases 22, for example oxygen and/or nitrogen. The use of the respective process gas 22 is dependent on the machining process, workpiece material and quality requirements for the cutting edges or welding seams. Furthermore, a suction device 24 is present, which is connected to a suction channel 26 located below the workpiece support 4. The process gas 22 is supplied to a process gas nozzle, such as a cutting gas nozzle 28 of the machining head 14, from which it emerges together with the laser beam 18. The laser processing machine 10 also has a machine control unit 30.

Figure 2:
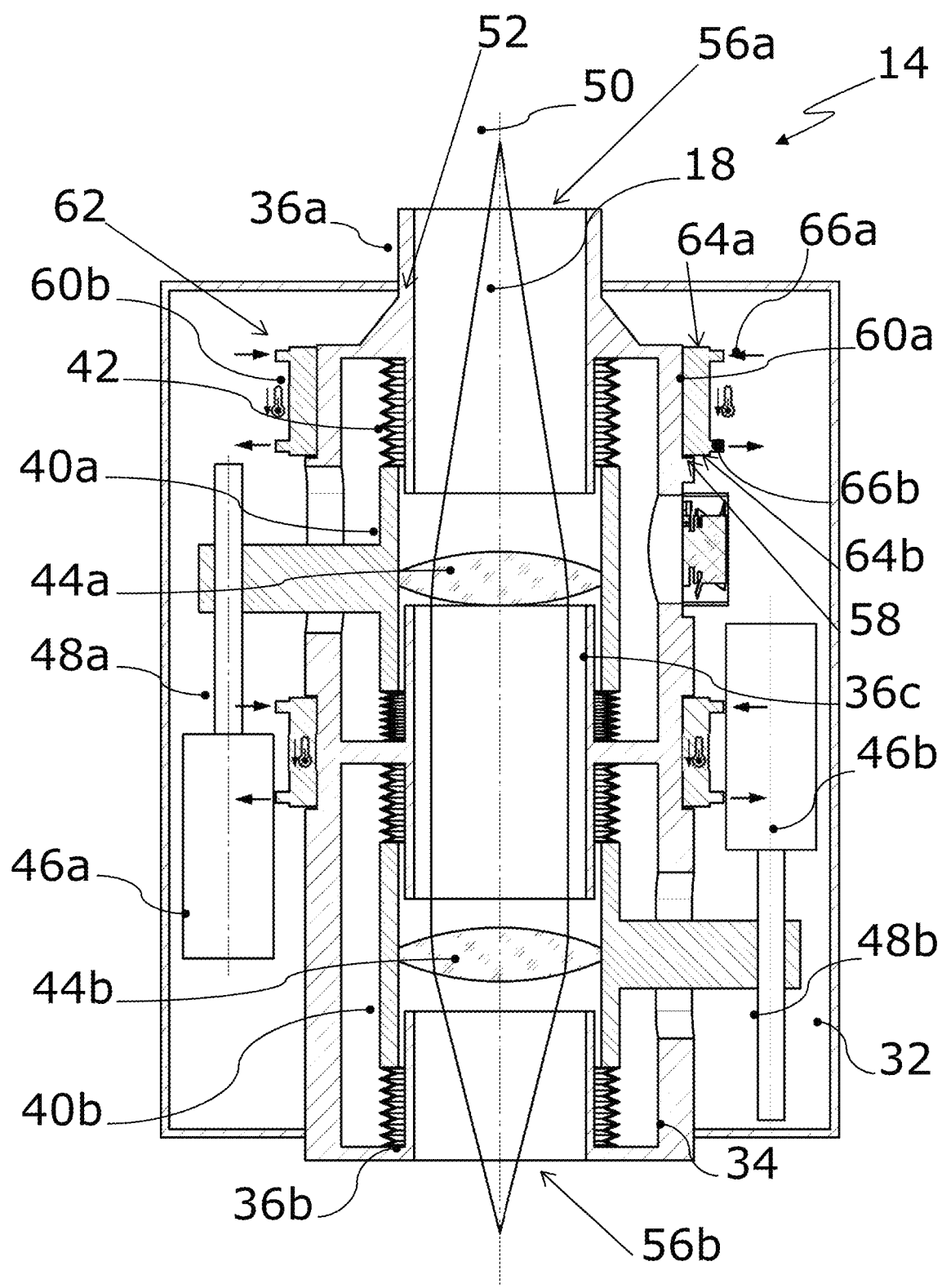
FIG. 2 is a first cross section through the beam-forming unit of FIG. 1.

FIG. 2 is a cross section through the beam-forming unit 14, being a laser machining head for forming a laser beam and for collimation and focusing a laser beam onto a workpiece 20. The beam-forming unit 14 has an outer housing 32 and an inner housing 34. The inner housing 34 is within the outer housing 32. Parts of the inner housing 34 are immovable components, three of which are exemplified by 36a, 36b, 36c. First and second movable components 40a, 40b are attached to the immovable components 36a, 36b, 36c via bellows, one of which is denoted by 42 here by way of example. The movable components 40a, 40b are respectively formed as a lens mount for a collimating lens 44a and a focusing lens 44b. The movable components 40a, 40b are moved by motors 46a, 46b and threaded rods 48a, 48b parallel to the direction of the longitudinal axis 50 of the beam-forming unit 14 or the optical axis. The movable and immovable components 36a, 36b, 36c, 40a, 40b form an interior cylindrical tube 52. The laser beam 18 passes through the cylindrical tube 52 from an inlet 56a to an outlet 56b at which a process gas nozzle (not shown) can be arranged.

A cooling system 58 of the beam-forming unit 14 has cooling plates, two of which are denoted by 60a, 60b here by way of example, of a cooling water circuit 62. The cooling plates 60a, 60b are attached to the outside of the inner housing 34. Cooling water enters each cooling plate 60a, 60b through an input, for example input 64a, in the form of an input current 66a into the cooling plate, for example cooling plate 60a, and exits through an output, for example output 64b, in the form of an output current 66b from the respective cooling plate, for example cooling plate 60b. Thereby, the cooling plates 60a, 60b can be connected to one another by fluidic connections (not shown) for transporting the cooling water.

Figure 3:
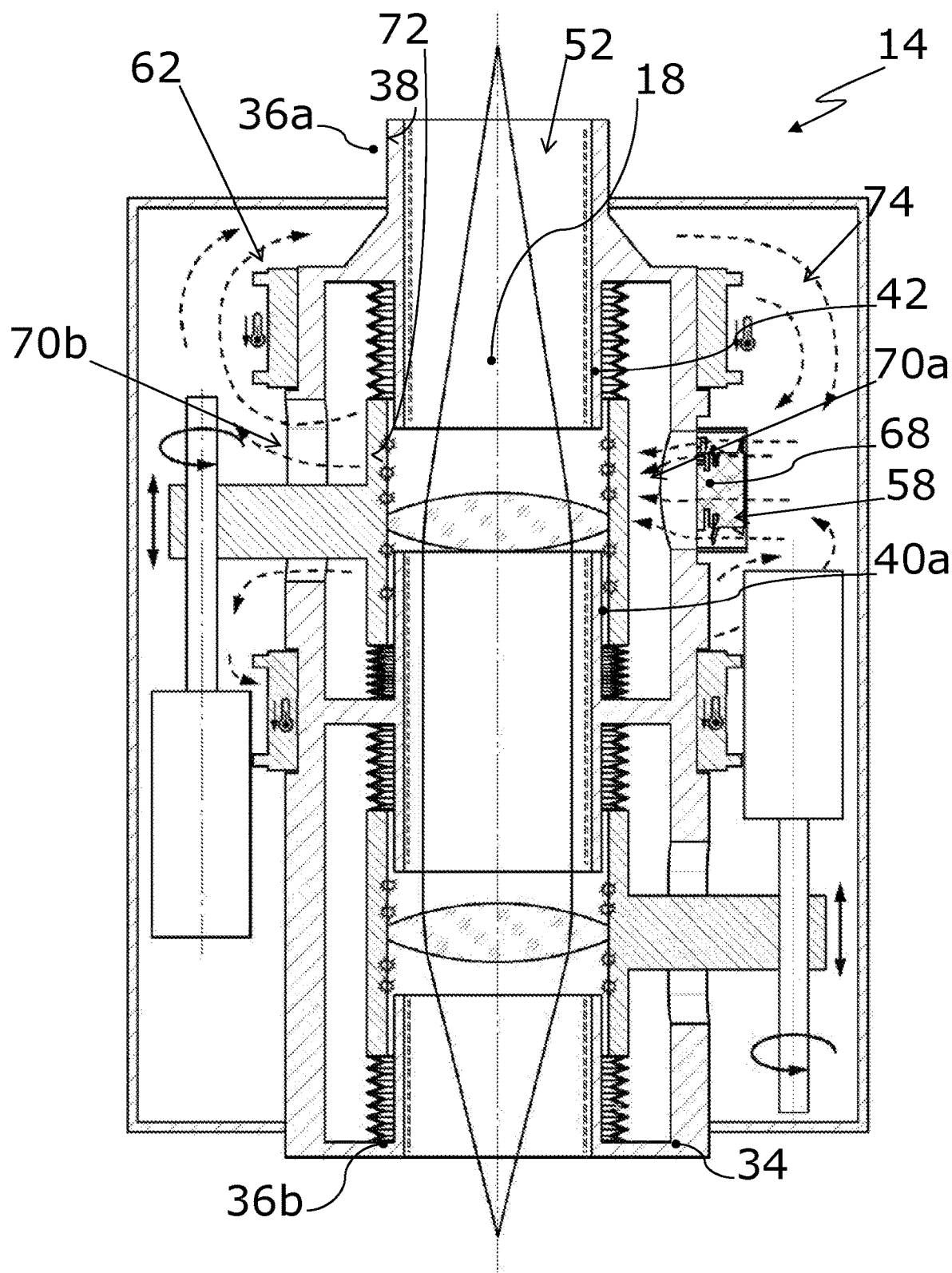
FIG. 3 is a second cross section through the beam-forming unit of FIG. 1.

FIG. 3 is a cross section through the beam-forming unit 14 with a switched-on fan 68 as part of the cooling system 58. The cooling system 58 can include a plurality of fans 68 at different locations of the beam-forming unit 14. The fan 68 is located outside the inner housing 34 at an entrance recessed passage 70a of the inner housing 34 in front of the first movable component 40a. An air flow 74 is sucked in by the fan 68 and conveyed to the first movable component 40a for cooling. The air is guided around the first movable component 40a and exits the inner housing 34 on the opposite side through an exit recessed passage (through bore) 70b. The bellows 42 prevents entry of air into the cylindrical tube 52 and into the interior of the first movable component 40a. The air is sucked in by the fan 68 and thereby guided around the inner housing 34 after exiting the exit recessed passage (through bore) 70b and is guided past the cooling water circuit 62 attached to the inner housing 34. This cools the air before it is returned to the movable component 40a in the interior of the inner housing 34 by the fan 68.

The immovable components 36a, 36b, 36c have at least partial laser radiation absorbent surfaces on their radially inner surfaces, which are indicated by double dashed lines, and one of which is denoted by 38 here by way of example. The radiation absorbent surfaces can be produced for example by black chrome plating, anodizing, powder coating, spraying graphite lacquer, or by surface treatment of the immovable components 36a, 36b, 36c with laser radiation. The movable components 40a, 40b each have a coating that reflects laser radiation, one of which is denoted by 72 here with small light flashes by way of example, on its radially inner surface to reduce heating of the movable components 40a, 40b by scattered laser radiation. This coating can be, for example, gold or a gold alloy (e.g., AuCo0.2).

In general, the beam-forming unit 14 for focusing a laser beam 18 onto a workpiece 20 for laser machining includes a cooling system 58 that can actively drive the flow of a cooling medium. The beam-forming unit 14 can be at least partially coated with a coating 72 configured for reflecting the laser beam 18 to reduce heating of the beam-forming unit 14. The beam-forming unit 14 can have an outer housing 32. An immovable component 36a, 36b, 36c can be immovably arranged or formed relative to the outer housing 32. A movable component 40a, 40b may be movably arranged or formed relative to the immovable component 36a, 36b, 36c. The movable component 40a, 40b can have a reflective interior and the immovable component 36a, 36b, 36c an radiation absorbent interior coating. The movable component 40a, 40b can be cooled by a fan and/or the immovable component 36a, 36b, 36c by flow-through cooling plates 60a, 60b.

OTHER EMBODIMENTS

A number of embodiments of the invention have been described. Nevertheless, it will be understood that various modifications may be made without departing from the spirit and scope of the invention. Accordingly, other embodiments are within the scope of the following claims.

LIST OF REFERENCE SIGNS

10 Laser processing machine
12 Laser beam generator
14 Beam-forming unit/Laser machining head
16 Workpiece support
18 Laser beam
20 Workpiece
22 Process gases
24 Suction device
26 Suction channel
28 Cutting gas nozzle
30 Machine control unit
32 Outer housing
34 Inner housing
36a, b, c Immovable components
38 Radiation absorbent coatings
40a, b Movable components
42 Bellows
44a Collimating lens
44b Focusing lens 46 Motors
48 Threaded rods
50 Longitudinal axis
52 Cylindrical tube
56a, b Inlet, outlet tube
58 Cooling system
60a, b Cooling plates
62 Cooling water circuit
64a, b Input, output cooling plate
66a, b Input current, output current
68 Fan
70a, b Entrance/exit recessed passage (through bore) of the inner housing
72 Reflective coating
74 Air flow

What is claimed is:

1. A beam-forming unit for forming a laser beam and focusing the laser beam onto a workpiece, the beam-forming unit comprising:
    a movable component;
    an immovable component; and
    a cooling system configured for forced movement of a cooling medium comprising one or both of air or a gas to actively cool the movable component, wherein the cooling system comprises:
        a cooling water circuit arranged on or within the immovable component for water cooling of both the immovable component and of the cooling medium,
        one or more cooling regions arranged on or within the immovable component and connected to the cooling water circuit for cooling water to flow through an interior of the one or more cooling regions and for the cooling medium to flow along an exterior of the one or more cooling regions for convective cooling of the cooling medium, and
        a fan arranged on or within the immovable component for moving the cooling medium comprising one or both of air and gas for cooling of the movable component, and wherein the cooling system is arranged within an outer housing that is sealed from the environment, wherein the movement of the cooling medium cools the movable component.

2. The beam-forming unit of claim 1, further comprising a highly reflective coating on at least a portion of the beam-forming unit to reduce heating of the beam-forming unit.

3. The beam-forming unit of claim 2, wherein the movable component is coated with the highly reflective coating.

4. The beam-forming unit of claim 1, further comprising an inner housing in which the movable component is arranged.

5. The beam-forming unit of claim 4, wherein the inner housing has a through bore or recessed passage on which the fan is arranged.

6. The beam-forming unit of claim 1, further comprising a bellows on the movable component configured to shield an interior of the movable component from the cooling medium.

7. The beam-forming unit of claim 6, wherein the immovable component at least partially forms an inner housing.

8. The beam-forming unit of claim 1, further comprising at least one radiation absorbent surface on the immovable component.

9. The beam-forming unit of claim 8, wherein the immovable component with the at least one radiation absorbent surface has a cylindrical interior and directly surrounds the laser beam.

10. The beam-forming unit of claim 9, further comprising a bellows on the movable component configured to shield an interior of the movable component from the cooling medium, wherein the immovable component is connected to the movable component via the bellows.

11. A laser processing machine comprising:
    a beam-forming unit for forming a laser beam and focusing the laser beam onto a workpiece, the beam-forming unit comprising:
        a movable component;
        an immovable component; and
        a cooling system configured for forced movement of a cooling medium comprising one or both of air or a gas to actively cool the movable component, wherein the cooling system comprises:
            a cooling water circuit arranged on or within the immovable component for water cooling of the immovable component and of the cooling medium,
            one or more cooling regions arranged on or within the immovable component and connected to the cooling water circuit for cooling water to flow through an interior of the one or more cooling regions and for the cooling medium to flow along an exterior of the one or more cooling regions for convective cooling of the cooling medium, and
            a fan arranged on or within the immovable component for moving the cooling medium comprising one or both of air and gas for cooling of the movable component, wherein the movement of the cooling medium cools the movable component, and
    wherein the cooling system is arranged within an outer housing that is sealed from the environment.

12. The laser processing machine of claim 11, further comprising a highly reflective coating on at least a portion of the beam-forming unit to reduce heating of the beam-forming unit.

13. The laser processing machine of claim 12, wherein the movable component is coated with the highly reflective coating.

14. The laser processing machine of claim 13, further comprising an inner housing in which the movable component is arranged.

15. The laser processing machine of claim 14, wherein the inner housing has a through bore or recessed passage on which the fan is arranged.

16. The laser processing machine of claim 11, further comprising a bellows on the movable component configured to shield an interior of the movable component from the cooling medium.

17. The laser processing machine of claim 16, wherein the immovable component at least partially forms an inner housing.

18. The laser processing machine of claim 11, further comprising at least one radiation absorbent surface on the immovable component.

19. The laser processing machine of claim 18, wherein the immovable component with the at least one radiation absorbent surface has a cylindrical interior and directly surrounds the laser beam.

20. The laser processing machine of claim 19, further comprising a bellows on the movable component configured to shield an interior of the movable component from the cooling medium, wherein the immovable component is connected to the movable component via the bellows.

\* \* \* \* \*